(12) United States Patent
Keoshkerian et al.

(10) Patent No.: US 10,633,550 B2
(45) Date of Patent: Apr. 28, 2020

(54) MOLECULAR ORGANIC REACTIVE INKS FOR CONDUCTIVE SILVER PRINTING

(71) Applicant: Xerox Corporation, Norwalk, CT (US)

(72) Inventors: Barkev Keoshkerian, Thornhill (CA); Michelle N. Chrétien, Mississauga (CA); Adela Goredema, Ancaster (CA); Chad Smithson, Toronto (CA); Sarah J. Vella, Milton (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 15/692,201

(22) Filed: Aug. 31, 2017

(65) Prior Publication Data

US 2019/0062582 A1  Feb. 28, 2019

(51) Int. Cl.

| | |
|---|---|
| *C09D 11/52* | (2014.01) |
| *C09D 11/38* | (2014.01) |
| *C09D 11/03* | (2014.01) |
| *C23C 18/08* | (2006.01) |
| *C23C 18/14* | (2006.01) |
| *C07F 1/10* | (2006.01) |
| *C07F 1/00* | (2006.01) |
| *H01B 1/22* | (2006.01) |
| *H01L 51/00* | (2006.01) |
| *C23C 18/16* | (2006.01) |
| *C09D 11/00* | (2014.01) |
| *C23C 18/44* | (2006.01) |
| *C09D 11/30* | (2014.01) |

(52) U.S. Cl.
CPC ............. *C09D 11/52* (2013.01); *C07F 1/005* (2013.01); *C07F 1/10* (2013.01); *C09D 11/00* (2013.01); *C09D 11/03* (2013.01); *C09D 11/30* (2013.01); *C09D 11/38* (2013.01); *C23C 18/08* (2013.01); *C23C 18/14* (2013.01); *C23C 18/1692* (2013.01); *C23C 18/44* (2013.01); *H01B 1/22* (2013.01); *H01L 51/0005* (2013.01); *C23C 18/161* (2013.01)

(58) Field of Classification Search
CPC .......... C09D 11/36; C09D 11/52; H01B 1/22; C07C 225/22
USPC ................ 106/31.13; 174/257; 427/487
See application file for complete search history.

(56) References Cited

U.S. PATENT DOCUMENTS

| | | | |
|---|---|---|---|
| 7,270,694 B2 | 9/2007 | Li et al. | |
| 7,699,918 B2 * | 4/2010 | Odell ..................... | C09D 11/36 106/31.13 |
| 8,414,982 B2 * | 4/2013 | Hayoz .................. | C07C 225/22 427/487 |
| 8,765,025 B2 | 7/2014 | Wu et al. | |
| 9,486,996 B2 | 8/2016 | Ng et al. | |
| 9,725,614 B2 | 8/2017 | Liu et al. | |
| 9,752,040 B2 | 9/2017 | Goredema et al. | |
| 2006/0130700 A1 | 6/2006 | Reinartz | |
| 2014/0174801 A1 * | 6/2014 | Wei ......................... | H01B 1/22 174/257 |
| 2015/0004325 A1 | 1/2015 | Walker et al. | |
| 2015/0240101 A1 | 8/2015 | Chopra et al. | |
| 2017/0253757 A1 | 9/2017 | Salami et al. | |
| 2018/0312710 A1 * | 11/2018 | Vaseem .................. | C09D 11/52 |

FOREIGN PATENT DOCUMENTS

WO  WO 2013/175965 A1  11/2013

OTHER PUBLICATIONS

Ping Liu, et al., U.S. Appl. No. 15/339,399, filed Oct. 31, 2016, "Metal Nanoparticle Ink Composition for Printed Electronic Device Applications," not yet published.
Extended European Search Report issued in European Application No. 18187161.7—1102, dated Jan. 7, 2019, 6 pages.

\* cited by examiner

*Primary Examiner* — Khanh T Nguyen
(74) *Attorney, Agent, or Firm* — Marylou J. Lavoie, Esq. LLC

(57) ABSTRACT

An ink composition including a metal salt amine complex; wherein the metal salt amine complex is formed from a metal salt and an amine; a compound selected from the group consisting of a stable free radical, a photoacid generator, and a thermal acid generator; and an optional solvent. A process including forming a metal salt amine complex; adding a compound selected from the group consisting of a stable free radical, a photoacid generator, and a thermal acid generator to the metal salt amine complex to form an ink. A process forming conductive features on a substrate with the ink composition.

17 Claims, No Drawings

MOLECULAR ORGANIC REACTIVE INKS FOR CONDUCTIVE SILVER PRINTING

BACKGROUND

Disclosed herein is an ink composition comprising a metal salt amine complex; wherein the metal salt amine complex is formed from a metal salt and an amine; a compound selected from the group consisting of a stable free radical, a photoacid generator, and a thermal acid generator; and an optional solvent. Also disclosed is a process including forming a metal salt amine complex; and adding a compound selected from the group consisting of a stable free radical, a photoacid generator, and a thermal acid generator; to the metal salt amine complex to form an ink. Also disclosed is a process including providing an ink composition comprising a metal salt amine complex, wherein the metal salt amine complex is formed from a metal salt and an amine; a compound selected from the group consisting of a stable free radical, a photoacid generator, and a thermal acid generator; and an optional solvent; depositing the ink composition onto a substrate to form deposited features; and treating the deposited features on the substrate to form conductive features on the substrate.

Conductive inks are desired for fabricating conductive patterns for electronic device applications.

There are currently three broad methods for printing conductive patterns. One method is to print metallic flakes. A second method is to prepared stabilized nanoparticles of the metal and subsequently print them followed by sintering. This method allows sintering at much lower temperatures than the bulk metal would require. A third method is to print metallic complexes that are then converted to the metal on the image substrate or object by chemical means.

Printable electronics inks typically use one of these methods, for example printing silver flakes, printing silver nanoparticles, or using silver complexes as the conductive element or conductive precursor prior to printing. For each of these ink categories, there can be drawbacks in ink stability, ease of preparation, and post printing requirements. Metallic flakes can be difficult to print via ink jet printing. Nanoparticle inks can be difficult to prepare and keep stable. Even small increases in the size of the nanoparticles, for example, from 5 nanometers to 10 nanometers in average particle diameter, can result in a 30° C. change in sintering temperatures. Metal complex precursors offer flexibility in terms of printing latitude, but can be difficult to prepare and handle, and can be cost prohibitive.

Solution processable conducting materials, including silver nanoparticle inks, play an important role in electronic device integrations. Conductive inks that can be easily dispersed in suitable solvents and used to fabricate various conducting features in electronic devices such as electrodes and electrical interconnectors by low-cost solution deposition and patterning techniques including spin coating, dip coating, aerosol printing, and ink jet printing technologies are particularly desired.

Xerox® Corporation has invented a nanosilver particle which is stabilized by an organoamine U.S. Pat. No. 8,765,025, which is hereby incorporated by reference herein in its entirety, describes a metal nanoparticle composition that includes an organic-stabilized metal nanoparticle and a solvent in which the solvent selected has the following Hansen solubility parameters: a dispersion parameter of about 16 MPa$^{0.5}$, or more, and a sum of a polarity parameter and a hydrogen bonding parameter of about 8.0 MPa$^{0.5}$ or less. U.S. Pat. No. 7,270,694, which is hereby incorporated by reference herein in its entirety, describes a process for preparing stabilized silver nanoparticles comprising reacting a silver compound with a reducing agent comprising a hydrazine compound by incrementally adding the silver compound to a first mixture comprising the reducing agent, a stabilizer comprising an organoamine, and a solvent.

U.S. patent application Ser. No. 13/866,704, which is hereby incorporated by reference herein in its entirety, describes stabilized metal-containing nanoparticles prepared by a first method comprising reacting a silver compound with a reducing agent comprising a hydrazine compound by incrementally adding the silver compound to a first mixture comprising the reducing agent, a stabilizer comprising an organoamine, and a solvent. U.S. patent application Ser. No. 14/188,284, which is hereby incorporated by reference herein in its entirety, describes conductive inks having a high silver content for gravure and flexographic printing and methods for producing such conductive inks.

U.S. patent application Ser. No. 15/061,618, which is hereby incorporated by reference herein in its entirety, describes in the Abstract thereof an ink composition including a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the ink composition has a metal content of greater than about 45 percent by weight, based upon the total weight of the ink composition; wherein the ink composition has a viscosity of from about 5 to about 30 centipoise at a temperature of about 20 to about 30° C. A process for preparing the ink composition. A process for printing the ink composition comprising pneumatic aerosol printing.

U.S. patent application Ser. No. 14/630,899, which is hereby incorporated by reference herein in its entirety, describes in the Abstract thereof a process including selecting a printing system; selecting an ink composition having ink properties that match the printing system; depositing the ink composition onto a substrate to form an image, to form deposited features, or a combination thereof; optionally, heating the deposited features to form conductive features on the substrate; and performing a post-printing treatment after depositing the ink composition.

U.S. patent application Ser. No. 14/594,746, which is hereby incorporated by reference herein in its entirety, describes in the Abstract thereof a nanosilver ink composition including silver nanoparticles; polystyrene; and an ink vehicle. A process for preparing a nanosilver ink composition comprising combining silver nanoparticles; polystyrene; and an ink vehicle. A process for forming conductive features on a substrate using flexographic and gravure printing processes comprising providing a nanosilver ink composition comprising silver nanoparticles; polystyrene; and an ink vehicle; depositing the nanosilver ink composition onto a substrate to form deposited features; and heating the deposited features on the substrate to form conductive features on the substrate.

U.S. patent application Ser. No. 15/339,399, which is hereby incorporated by reference herein in its entirety, describes in the Abstract thereof an ink composition including a metal nanoparticle; a viscous heat decomposable liquid, wherein the viscous heat decomposable liquid imparts a desired viscosity to the ink composition and which evaporates at a sintering temperature of the metal nanoparticle; an optional solvent; wherein the ink composition has a metal content of less than about 25 percent by weight, based upon the total weight of the ink composition; and wherein the ink composition has a viscosity of from about 50 to about 200 centipoise at a temperature of about 20 to about 30° C. A process for preparing the ink composition and for printing the ink composition. A flexographic printing process or gravure printing process including the ink composition.

While currently available conductive inks are suitable for their intended purposes, there remains a need for improved inks suitable for conductive ink applications. There further remains a need for alternative means for preparing inks that are low cost, easy to prepare, and have low post printing complexity. There further remains a need for such improved inks that are suitable as conductive inks for both two dimensional and three dimensional printing applications.

The appropriate components and process aspects of the each of the foregoing U. S. Patents and Patent Publications may be selected for the present disclosure in embodiments thereof. Further, throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

SUMMARY

Described is an ink composition comprising: a metal salt amine complex; wherein the metal salt amine complex is formed from a metal salt and an amine; a compound selected from the group consisting of a stable free radical, a photoacid generator, and a thermal acid generator; and an optional solvent.

Also described is a process comprising forming a metal salt amine complex; and adding a compound selected from the group consisting of a stable free radical, a photoacid generator, and a thermal acid generator; to the metal salt amine complex to form an ink.

Also described is a process comprising providing an ink composition comprising a metal salt amine complex, wherein the metal salt amine complex is formed from a metal salt and an amine; a compound selected from the group consisting of a stable free radical, a photoacid generator, and a thermal acid generator; and an optional solvent; depositing the ink composition onto a substrate to form deposited features; and treating the deposited features on the substrate to form conductive features on the substrate.

DETAILED DESCRIPTION

A molecular organic reactive ink composition herein comprises a shelf ink that is stable at room temperature. The molecular organic reactive ink can be deposited, such as printed, and evaporated to create conductive features. The ink composition comprises a metal salt amine complex, wherein the metal salt amine complex is formed from a metal salt and an amine; a stable free radical; and an optional solvent.

In embodiments, an ink composition herein comprises a metal salt amine complex; wherein the metal amine complex is formed from a metal salt and an amine; a compound selected from the group consisting of a stable free radical, a photoacid generator, and a thermal acid generator; and an optional solvent.

In embodiments, a metal salt precursor is combined with an amine to initially form an amine metal complex. The amine metal complex is mixed with a stable free radical. In the presence of the stable free radical, the amine metal complex is stable at room temperature. The resulting ink can be printed using any suitable or desired printing process. In embodiments, the printed ink is then heated from room temperature to an elevated temperature suitable to provide conductive metal pathways. In embodiments, the amine metal complex is an amine silver complex.

In embodiments, a metal salt precursor is combined with an amine to initially form an amine metal complex. The amine metal complex is then mixed with a photoacid generator material, in embodiments, mixed at room temperature with simple mixing. The resulting ink can be printed using any suitable or desired process. In embodiments, the printed ink is then exposed to irradiation, in embodiments, ultraviolet (UV) radiation, at any suitable or desired temperature, in embodiments, from room temperature to an elevated temperature selected according to the application, to generate an acid that will reduce the metal complex and afford conductive metal pathways. In embodiments, the amine metal complex is an amine silver complex.

Metal Salt.

The metal salt selected for embodiments herein can comprise any suitable or desired metal. In embodiments, the metal salt comprises a metal selected from the group consisting of silver, cobalt, copper, nickel, gold, palladium, and combinations thereof.

In embodiments, the silver may be elemental silver, a silver alloy, or a combination thereof. In embodiments, the silver may be a base material coated or plated with pure silver, a silver alloy, or a silver compound. For example, the base material may be copper flakes with silver plating. The silver alloy may be formed from at least one metal selected from Au, Cu, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Si, As, Hg, Sm, Eu, Th, Mg, Ca, Sr, and Ba, although not limited.

In embodiments, the silver compound may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. In certain embodiments the silver is composed of elemental silver.

In embodiments, the metal may comprise solely elemental silver or may be a silver composite, including composites with other metals. Such silver composites may include either or both of (i) one or more other metals and (ii) one or more non-metals. Suitable other metals include, for example Al, Au, Pt, Pd, Cu, Co, Cr, In and Ni, such as, the transition metals, for example, Au, Pt, Pd, Cu, Cr, Ni and mixtures thereof. Exemplary metal composites are Au—Ag, Ag—Cu, Au—Ag—Cu and Au—Ag—Pd. Suitable non-metals in the silver composite include, for example, Si, C and Ge. The various non-silver components of the silver composite may be present in an amount ranging, for example, from about 0.01% to about 99.9% by weight, from about 10% to about 90% by weight. In embodiments, the silver composite is a metal alloy composed of silver and one, two or more other metals, with silver comprising, for example, at least about 20% of the composite by weight, or greater than about 50% of the composite by weight. Unless otherwise noted, the weight percentages recited herein for the components of the silver-containing composite do not include a stabilizer.

Silver composed of a silver composite can be made, for example, by using a mixture of: (i) a silver compound (or compounds, such as, a silver (I) ion-containing compound); and (ii) another metal salt (or salts) or another non-metal (or non-metals) during a reduction step.

The metal salt can be present in the metal salt amine complex in any suitable or desired amount. In embodiments, the metal salt is present in the metal salt amine complex in an amount of from about 15 to about 50, or from about 25 to about 40, or from about 33 to about 35 mole percent.

In certain embodiments, the metal salt amine complex comprises a silver salt amine complex or a silver salt ammonia complex.

In the ink compositions herein, the metal salt in the presence of an amine forms a metal salt amine complex. In the presence of, in embodiments, a stable free nitroxide, the ink composition is stable at room temperature. Room temperature can be, for example, from about 20 to about 25° C.

Any suitable or desired metal salt can be selected. Any suitable or desired metal can be used for the metal salts including the metals described herein above. In embodiments, the metal salt comprises a metal selected from the group consisting of cobalt, silver, copper, nickel, gold, palladium, and combinations thereof. In embodiments, the metal salt is selected from the group consisting of metal benzoate, metal halide, metal carbonate, metal citrate, metal iodate, metal iodide, metal nitrite, metal nitrate, metal acetate, metal phosphate, metal sulfate, metal sulfide, metal trifluoroacetate, and combinations thereof.

In specific embodiments, the metal salt comprises a member selected from the group consisting of silver nitrate, silver acetate, silver fluoride, and combinations thereof.

Amine.

Any suitable or desired amine can be selected for the metal salt amine complex. In embodiments, the metal salt amine complex is formed using an amine comprising a member of the group consisting of ammonia, methylamine, ethylamine, propylamine, butylamine, and isomers, and combinations thereof, diamines such as ethylenediamine, triamines, polyamines, and combinations thereof.

The amine can be present in the metal salt amine complex in any suitable or desired amount. In embodiments, the amine is present in the metal salt amine complex in an amount of from about 50 to about 500, or from about 200 to about 400, or from about 200 to about 300 mole percent.

The metal salt amine complex can be present in the ink composition in any suitable or desired amount. In embodiments, the metal salt amine complex is present in the ink composition in an amount of from about 5 to about 80, or from about 10 to about 50, or from about 15 to about 35 percent by weight, based upon the total weight of the ink composition.

Stable Free Radical.

The ink composition includes a compound that can reduce the silver ion to the silver metal once the silver ion is deprotected.

In embodiments, the ink composition includes a stable free radical. Stable free radical as used herein means molecules that have an unpaired electron that is stable as either a solid or in solution.

Any suitable or desired stable free radical can be selected. In embodiments, the stable free radical is a compound selected from the group consisting of aminoxyl radicals (also known as nitroxides), hydrazyls, and trityl radicals, and combinations thereof.

In certain embodiments, the stable free radical is a nitroxide selected from the group consisting of hydroxytempo, tempo, oxotempo, and combinations thereof.

In embodiments, hydroxytempo, also called 4-Hydroxy-TEMPO or TEMPOL, formally 4-hydroxy-2,2,6,6-tetramethylpiperidin-1-oxyl, is a compound of the formula/formulae:

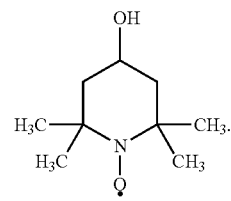

In embodiments, tempo, also called (2,2,6,6-tetramethyl-piperidin-1-yl)oxyl, is a compound of the formula:

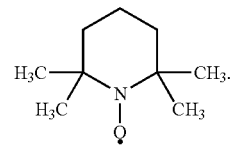

In embodiments, oxotempo, also called 4-oxo-tempo, is a compound of the formula

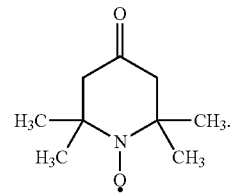

The stable free radical can be present in ink composition in any suitable or desired amount. In embodiments, the stable free radical is present in the ink composition in an amount of from about 10 to about 200, or from about 30 to about 150, or from about 50 to about 100 mole percent of the silver salt concentration.

In specific embodiments, a silver salt precursor and an amine are combined to form an amine silver complex. The amine silver complex is then mixed with a stable free radical, in embodiments, a stable free nitroxide, at room temperature with simple mixing to form an ink composition. The ink composition can then be printed using any suitable or desired printing process, in embodiments, using a two dimensional printing process, a three dimensional printing process, or a combination thereof, and then heated from room temperature to a suitable temperature sufficient to remove the amine and form a conductive silver image. In some embodiments, the amine can be evaporated off at room temperature. The conductive silver image can be used for any suitable or desired application, in embodiments, to afford conductive silver pathways for circuits or three dimensional objects.

An elegant way to prepare silver is through the use of Tollen's reagent where silver nitrate is mixed with ammonia to prepare a silver ammonia complex in accordance with the following reaction scheme.

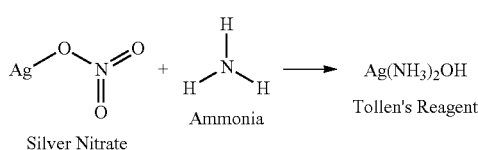

The silver ammonia complex (Tollen's Reagent) can then be reduced by different means to give pure silver.

The silver needs an electron to be reduced to the pure metal. Any suitable or desired method can be employed to provide the electron. In embodiments, a stable free radical can be selected. In specific embodiments, the electron source can be provided by using a nitroxide as the stable free radical electron source.

Mixing the stable free radical with the metal salt solution results in the formation of the pure metal instantaneously. Thus, mixing the stable free radical with silver nitrate solution results in the formation of pure silver instantaneously.

In embodiments, the method herein comprises mixing Tollen's reagent with a stable free radical, in embodiments, a nitroxide, to provide a stable ink composition until the amine is evaporated which destabilizes the complex and the metal nitrate is reduced by the stable free radical.

The evaporation of the amine can be accomplished by any suitable or desired method. In embodiments, the evaporation can be effected either at room temperature or at elevated temperature. In embodiments, elevated temperature can be from about 40 to about 150° C., or from about 50 to about 130° C., or from about 60 to about 120° C.

Photoacid Generator.

In embodiments, molecular organic reactive inks for conductive metal printing are provided using photogenerated acids.

In embodiments, the method herein comprises mixing Tollen's reagent with a photoacid generator material, to provide a stable ink composition until the ink composition is irradiated to generate the acid and reduced the complex to the metal.

In embodiments, a metal salt precursor is combined with an amine to initially form an amine metal complex. The amine metal complex is then mixed with a photoacid generator material.

Thus, similar to the embodiments described herein comprising a stable free radical which is stable until treated to allow the metal to be reduced, acids can accomplish this reduction. The concept is to use photogenerated acids which can be easily mixed with the Tollen's reagent without causing immediate reaction with the base and that upon irradiating with UV light will generate the acid in-situ and thus reduce the complex to the metallic silver. The use of heat to increase the evaporation of the amine can also be done simultaneously.

Any suitable or described photoacid generator can be selected for embodiments herein. Photoacid generators are well known in the photoresist field and are commonly used in that industry. Hence common photoacid generators are such as those sold by BASF and are available as both ionic (for aqueous) and non-ionic systems. Examples include Irgacure® 250, CGI 725, Irgacure® PAG 103 and others. Other suitable photoacid generators include readily available diphenyliodonium salts such as nitrates and triflates.

A photoinitiator that absorbs radiation, for example UV light radiation, to initiate curing of the curable components of the ink may be used as the photoacid generator. As the photoinitiator for inks that are cured by free radical polymerization, e.g., inks containing acrylate groups or inks comprised of polyamides, mention may be made of photoinitiators such as benzophenones, benzoin ethers, benzil ketals, α-hydroxyalkylphenones, α-aminoalkylphenones and acylphosphine photoinitiators sold under the trade designations of IRGACURE and DAROCUR from Ciba. Specific examples include 2,4,6-trimethylbenzoyldiphenylphosphine oxide (available as BASF LUCIRIN TPO); 2,4,6-trimethylbenzoylethoxyphenylphosphine oxide (available as BASF LUCIRIN TPO-L); bis(2,4,6-trimethylbenzoyl)-phenylphosphine oxide (available as Ciba IRGACURE 819) and other acyl phosphines; 2-methyl-1-(4-methylthio)phenyl-2-(4-morpholinyl)-1-propanone (available as Ciba IRGACURE 907) and 1-(4-(2-hydroxyethoxy)phenyl)-2-hydroxy-2-methylpropan-1-one (available as Ciba IRGACURE 2959); 2-benzyl 2-dimethylamino 1-(4-morpholinophenyl) butanone-1 (available as Ciba IRGACURE 369); 2-hydroxy-1-(4-(4-(2-hydroxy-2-methylpropionyl)-benzyl)-phenyl)-2-methylpropan-1-one (available as Ciba IRGACURE 127); 2-dimethylamino-2-(4-methylbenzyl)-1-(4-morpholin-4-ylphenyl)-butanone (available as Ciba IRGACURE 379); titanocenes; isopropylthioxanthone; 1-hydroxy-cyclohexylphenylketone; benzophenone; 2,4,6-trimethylbenzophenone; 4-methylbenzophenone; diphenyl-(2,4,6-trimethylbenzoyl) phosphine oxide; 2,4,6-trimethylbenzoylphenylphosphinic acid ethyl ester; oligo(2-hydroxy-2-methy-1-(4-(1-methylvinyl)phenyl) propanone); 2-hydroxy-2-methyl-1-phenyl-1-propanone; benzyl-dimethylketal; and mixtures thereof. Mention may also be made of amine synergists, i.e., co-initiators that donate a hydrogen atom to a photoinitiator and thereby form a radical species that initiates polymerization (amine synergists can also consume oxygen dissolved in the ink—as oxygen inhibits free radical polymerization its consumption increases the speed of polymerization), for example such as ethyl-4-dimethylaminobenzoate and 2-ethylhexyl-4-dimethylaminobenzoate. This list is not exhaustive, and any known photoinitiator that initiates the free radical reaction upon exposure to a desired wavelength of radiation such as UV light can be used without limitation.

Radiation as used herein is intended to cover all forms of curing upon exposure to a radiation source, including light and heat sources and including in the presence or absence of initiators. Example radiation curing routes include, but are not limited to, curing using ultraviolet (UV) light, for example having a wavelength of 200-400 nm or more rarely visible light, preferably in the presence of photoinitiators and/or sensitizers, curing using e-beam radiation, preferably in the absence of photoinitiators, curing using thermal curing, in the presence or absence of high temperature thermal initiators (and which are preferably largely inactive at the jetting temperature), and appropriate combinations thereof. In embodiments, irradiation comprises ultra-violet irradiation.

Irradiation can be for any suitable or desired time. In embodiments, the printed inks can be irradiated for a period of from about 0.1 second to about 10 minutes, or from about 5 seconds to about 1 minute, or from about 10 seconds to about 30 seconds.

In certain embodiments, the printed inks can be UV irradiated for a period of from about 0.1 second to about 10 minutes, or from about 5 seconds to about 1 minute, or from about 10 seconds to about 30 seconds.

The metal salt amine complex can be present in the ink composition in any suitable or desired amount as described hereinabove.

The photoacid generator can be present in ink composition in any suitable or desired amount. In embodiments, the photoacid generator is present in the ink composition in an amount of from about 10 to about 200, or from about 30 to about 150, or from about 50 to about 100 mole percent of the metal salt concentration, in embodiments, the silver salt concentration.

Thermal Acid Generator.

In embodiments, molecular organic reactive inks for conductive metal printing are provided using thermal generator acids.

In embodiments, an amine metal complex as described herein is mixed with a thermal acid generator material, at room temperature with simple mixing. The resulting ink can then be 2D or 3D printed using an appropriate process and then heated from room temperature to an elevated temperature, such as up to about 130° C. (depending on the application) to generate an acid that will reduce the metal complex and afford conductive metal pathways for circuits or 3D objects.

In embodiments, the method herein comprises mixing Tollen's reagent with a thermal acid generator material, to provide a stable ink composition until the ink composition is heated to generate the acid and reduced the complex to the metal.

In embodiments, a metal salt precursor is combined with an amine to initially form an amine metal complex. The amine metal complex is then mixed with a thermal acid generator material.

In embodiments, acids can accomplish the reduction. The concept is to use blocked acids which can be easily mixed with the Tollen's reagent without causing immediate reaction with the base and that upon heating will generate the acid in-situ and thus reduce the complex to the metallic silver. The use of heat also facilitates the evaporation of the base and aids in the formation of the silver metal. Thus with a judicious choice of a complexing amine and a blocked acid, a thermally generated acid will reduce the silver salt to silver metal below 100° C.

Any suitable or desired thermal acid generator can be selected for embodiments herein. Commercially available blocked acids are available as either amine blocked or covalently blocked. Commercial materials can be obtained from, for example, King Industries. See Table 1 for differing temperature acid generators.

TABLE 1

| Blocked Acid Catalysts | Minutes Cure (° C.) |
| --- | --- |
| NACURE 8924 | 25 |
| NACURE 2500 | 80 |
| NACURE 2501 | 80 |
| NACURE 2530 | 80 |
| NACURE X49-110 | 90 |
| NACURE 2107 | 90 |
| NACURE 2547 | 90 |
| NACURE 2558 | 90 |
| NACURE 3327 | 107 |

Heating can comprise heating to any suitable or desired temperature. In embodiments, the printed inks can be heated to a temperature of from about 40 to about 150° C., or from about 60 to about 120° C., or from about 80 to about 100° C.

Heating can be for any suitable or desired time. In embodiments, the printed inks can be heated for a period of from about 1 to about 180 minutes, or from about 20 to about 120 minutes, or from about 30 to about 60 minutes.

The metal salt amine complex can be present in the ink composition in any suitable or desired amount as described hereinabove.

The thermal acid generator can be present in ink composition in any suitable or desired amount. In embodiments, the thermal acid generator is present in the ink composition in an amount of from about 10 to about 200, or from about 30 to about 150, or from about 50 to about 100 mole percent of the metal salt concentration, in embodiments, the silver salt concentration.

Solvent.

The ink composition can include a solvent. Any suitable or desired solvent can be selected. In embodiments, the selected solvent is miscible with the silver amine complex/nitroxide system. In instances when the amine is water soluble, water or a combination of water and an additional solvent can be selected. The additional solvent can be any suitable or desired solvent, including solvents that are miscible with water. If it is undesirable to include water, the solvent can be an organic solvent provided the selected amine is soluble in the organic solvent.

In embodiments, the solvent is selected from the group consisting of water, organic solvents, and combinations thereof. In certain embodiments, the solvent is selected from the group consisting of water, alcohol, and combinations thereof.

Suitable water-miscible solvents include, but are not limited to, butanols, acetaldehyde, acetone, acetonitrile, 1,2-Butanediol, 1,3-Butanediol, 1,4-Butanediol, 2-Butoxyethanol, diethanolamine, diethylenetriamine, dimethylformamide, dimethoxyethane, dimethyl sulfoxide, 1,4-Dioxane, ethanol, ethylamine, ethylene glycol, formic acid, furfuryl alcohol, glycerol, methanol, methyl diethanolamine, 1-Propanol, 1,3-Propanediol, 1,5-Pentanediol, 2-Propanol, propylene glycol, pyridine, tetrahydrofuran, triethylene glycol, tetrahydrofuran, and combinations thereof.

The solvent can be present in the ink composition in any suitable or desired amount. In embodiments, the solvent is present in the ink composition complex in an amount of from about 5 to about 95, or from about 10 to about 70, or from about 15 to about 50 percent by weight, based upon the total weight of the ink composition.

In embodiments, the amine of the metal amine complex further functions as the solvent in addition to forming the metal amine complex with the metal salt. In this case, the ink composition may optionally include water or other solvent, or may include the amine of the metal amine complex as the sole solvent. In such cases, the amine would make up the bulk of the weight. In such embodiments, the amine is present in the ink composition in an amount of from about 5 to about 95, or from about 10 to about 70, or from about 15 to about 50 percent by weight, based upon the total weight of the ink composition.

The ink compositions can be prepared by any suitable process, such as by simple mixing of the ingredients. One process entails mixing all of the ink ingredients together and filtering the mixture to obtain an ink. Inks can be prepared by mixing the ingredients, heating if desired, and filtering, followed by adding any desired additional additives to the mixture and mixing at room temperature with moderate shaking until a homogeneous mixture is obtained, in embodiments from about 5 to about 10 minutes, up to about 24 hours. Alternatively, the optional ink additives can be mixed with the other ink ingredients during the ink preparation process, which takes place according to any desired procedure, such as by mixing all the ingredients, heating if desired, and filtering.

In embodiments, a process herein comprises forming a metal salt amine complex; and adding a compound selected from the group consisting of a stable free radical, a photoacid generator, and a thermal acid generator; to the metal salt amine complex to form an ink.

In embodiments, the ink composition can be prepared by a process comprising forming a metal salt amine complex; and adding a stable free radical to the metal salt amine complex to form an ink.

In embodiments, the ink composition can be prepared by forming a metal salt amine complex; and adding a stable free radical to the metal salt amine complex to form an ink, wherein forming the metal salt amine complex comprises combining a metal salt and water; and adding an amine to form the metal salt amine complex.

In embodiments, the ink composition can be prepared by forming a metal salt amine complex; and adding a stable free radical to the metal salt amine complex to form an ink, wherein forming the metal salt amine complex comprises providing a metal salt; adding an amine to form the metal salt amine complex; wherein the amine functions as an ink solvent in addition to forming the metal amine complex with the metal salt.

The ink composition can be employed in any suitable or desired printing process. The molecular organic reactive ink composition can be deposited by any suitable or desired method. In embodiments, the molecular organic reactive ink composition can be deposited by a method comprising coating the molecular organic reactive ink composition onto a substrate, in embodiments, polyethylene terephthalate (PET) film, allowing the amine to evaporate, and, optionally, measuring the resistivity of the resulting layer.

In embodiments, a process for forming conductive features on a substrate herein comprises providing the present ink composition; depositing the ink composition onto a substrate to form deposited features; and heating the deposited features on the substrate to form conductive features on the substrate. In embodiments, the process for forming conductive features on a substrate comprises an ink jet printing process, a two dimensional printing process, a three dimensional printing process, a flexographic printing process, a gravure printing process, or a combination thereof.

In embodiments, a process herein comprises providing the present ink composition; depositing the ink composition onto a substrate to form deposited features, an ink image, or a combination thereof. In embodiments, the process further comprises heating or otherwise treating the deposited features on the substrate to form conductive features on the substrate.

In embodiments, a process herein comprises providing an ink composition comprising a metal salt amine complex, wherein the metal salt amine complex is formed from a metal salt and an amine; a compound selected from the group consisting of a stable free radical, a photoacid generator, and a thermal acid generator; and an optional solvent; depositing the ink composition onto a substrate to form deposited features; and treating the deposited features on the substrate to form conductive features on the substrate.

In embodiments, a process herein comprises: providing an ink composition comprising a metal salt amine complex, wherein the metal salt amine complex is formed from a metal salt and an amine; a stable free radical; and an optional solvent; depositing the ink composition onto a substrate to form deposited features; and treating the deposited features on the substrate to form conductive features on the substrate.

Treating the deposited features can comprise any suitable or desire method, in embodiments, a method that results in the formation of conductive features from the printed image. In embodiments, treating the deposited features comprises evaporating, or allowing to evaporate, the amine allowing the metal salt of the metal salt amine complex to be reduced on the substrate to form conductive features.

Treating can be by any suitable or desired method at any suitable or desired temperature or other conditions. In embodiments, treating the deposited features comprises evaporating the amine. In embodiments, treating the deposited features comprises evaporating the amine at room temperature allowing the metal salt of the metal salt amine complex to be reduced on the substrate to form conductive features.

In embodiments, treating the deposited features comprises evaporating the amine at an elevated temperature of from about 30 to about 140° C., or from about 45 to about 125° C., or from about 60 to about 90° C.

Thus, the coated substrate can be dried at any suitable or desired temperature. In embodiments, the coated substrate is dried at a temperature of from about 25 to about 150° C., or from about 40 to about 120° C., or from about 60 to about 90° C. In certain embodiments, the coated films, such as PET films, are dried at room temperature, 50° C., and 130° C. The weight of the film can be measured to dryness and the final resistivity taken at that point.

The fabrication of conductive features, such as an electrically conductive element, from the ink composition can be carried out by depositing the composition on a substrate using any suitable deposition technique including two dimensional printing processes, three dimensional printing processes, flexographic and gravure printing processes, among others, at any suitable time prior to or subsequent to the formation of other optional layer or layers on the substrate. Thus deposition of the ink composition on the substrate can occur either on a substrate or on a substrate already containing layered material, for example, a semiconductor layer and/or an insulating layer.

The substrate upon which the metal features are deposited may be any suitable substrate including silicon, glass plate, plastic film, sheet, fabric, or paper. For structurally flexible devices, plastic substrates such as polyester, polycarbonate, polyimide sheets, and the like, may be used. Printing dimensions can be any suitable or desired printing dimensions. The thickness of the substrate can be any suitable or desired thickness. In embodiments, the thickness of the substrate can be, for example, from as about 10 micrometers to over 10 millimeters, or from about 50 micrometers to about 2 millimeters, especially for a flexible plastic substrate, or from about 0.4 to about 10 millimeters for a rigid substrate such as glass or silicon.

Heating the deposited ink composition can be to any suitable or desired temperature, such as to from about 30° C. to about 200° C., or any temperature sufficient to induce the amine to evaporate and allow the metal salt to be reduced thus form an electrically conductive layer which is suitable for use as an electrically conductive element in electronic devices. The heating temperature is one that does not cause adverse changes in the properties of previously deposited layers or the substrate. In embodiments, use of low heating temperatures allows use of low cost plastic substrates which have an annealing temperature of below 200° C. As described herein, the heating temperature is also a temperature at which the viscous heat decomposable liquid decomposes or evaporates.

The heating can be for any suitable or desire time, such as from about 0.01 second to about 10 hours. The heating can be performed in air, in an inert atmosphere, for example under nitrogen or argon, or in a reducing atmosphere, for example, under nitrogen containing from about 1 to about 20 percent by volume hydrogen. The heating can also be performed under normal atmospheric pressure or at a reduced pressure of, for example, about 1000 mbars to about 0.01 mbars.

Heating encompasses any technique that can impart sufficient energy to the heated material or substrate to 1) evaporation of the amine, and/or (2) remove any optional stabilizer, and/or (3) anneal the metal. Examples of heating techniques include thermal heating (for example, at hot plate, an oven, and a burner), infra-red ("IR") radiation, laser beam, flash light, microwave radiation, or ultraviolet ("UV") radiation, or a combination thereof.

In embodiments, after heating, the resulting electrically conductive line has a thickness ranging from about 0.025 to about 10 micrometers, or from about 0.03 to about 5 micrometers. In certain embodiments, after heating, the resulting electrically conductive line has a thickness of from about 0.04 to about 2.5 micrometers. In embodiments, the ink composition provides a printed image having a bulk conductivity after heating of from about 75,000 to about 250,000 S/cm at a printed image line thickness of from about 0.05 to about 1 micrometer.

In, embodiments, the ink composition herein has a bulk conductivity that is more than about 50,000 S/cm. The conductivity of the resulting metal element produced by heating the deposited nanosilver ink composition is, for example, more than about 100 Siemens/centimeter (S/cm), more than about 1,000 S/cm, more than about 2,000 S/cm, more than about 5,000 S/cm, more than about 10,000 S/cm, or more than about 50,000 S/cm.

The resulting elements can be used for any suitable or desired application, such as for electrodes, conductive pads, interconnects, conductive lines, conductive tracks, and the like, in electronic devices such as thin film transistors, organic light emitting diodes, RFID tags, photovoltaic, displays, printed antenna, and other electronic devise which required conductive elements or components.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

Example 1

Control. To a vial was added silver nitrate (1.69 grams, 0.01 mol) and then methylamine solution (3 grams, 0.04 mol) and stirred for about 5 minutes until fully dissolved (exothermic). A small aliquot was weighed out and then coated onto 3 polyethylene terephthalate (PET) films. Each coated film was heated in an oven to 130° C. Occasionally, the film was taken out and the weight loss was measured along with the resistivity using a 2 point probe. Results are shown in Table 2.

TABLE 2

| Time (minutes) | Resistivity (ohms) (130° C.) | Weight (grams) (130° C.) |
|---|---|---|
| 0 |  | 0.251 |
| 5 | 30,000 | 0.103 |
| 20 | 30,000 | 0.098 |
| 60 | 30,000 | 0.089 |

Example 2

Silver nitrate with methylamine as base. To a vial containing silver nitrate (1.69 grams, 0.01 mol) was added methylamine solution (40% by weight with water, 3.1 grams, 0.04 mol). This was stirred for about 5 minutes until completely dissolved and then hydroxytempo (0.86 grams, 0.005 mol) was added. This was stirred for 5 minutes resulting in an orange colored ink.

A small aliquot was then coated onto 3 PET films and each was then tested and heated separately in an oven at room temperature, 50° C., and 130° C. Occasionally, the films were taken out and the weight loss was measured along with the resistivity using a 2 point probe. After a set time at temperature, the room temperature and 50° C. films were heated to 130° C. See Table 3 for results. The underlined times in Table 2 indicated how much time the films were elevated to 130° C. The films were usually taken to a constant weight loss.

TABLE 3

| Time (minutes) | Resistivity (ohms) | | | Time | Weight (grams) | | |
|---|---|---|---|---|---|---|---|
| | Room Temperature | 50° C. | 130° C. | | Room Temperature | 50° C. | 130° C. |
| | | | | 0 | 0.178 | 0.145 | 0.164 |
| 8 | 100 | 2.2 | 1 | | 0.132 | 0.095 | 0.079 |
| 20 | 50 | 3 | 0.6 | | 0.113 | 0.076 | 0.067 |
| <u>12</u> | 0.7 | 2 | 0.6 | | 0.083 | 0.062 | 0.048 |
| <u>40</u> | 0.5 | 0.5 | 0.6 | | Not measured | 0.053 | Not measured |
| <u>1.080</u> | 0.6 | 0.6 | 0.6 | | 0.049 | 0.042 | 0.047 |

Images were formed on PET film with the ink of Example 2. The ink of Example 2 was printed at room temperature, 60° C., and 130° C. Solid silver was formed at all three temperatures. The higher the temperature, the faster the conversion of the printed ink into silver.

Example 3

Silver acetate with methylamine, hydroxytempo, and ethanol. To a vial containing silver acetate (1.66 grams, 0.01 mol) was added methylamine solution (40% by weight with water, 3 grams, 0.04 mol) and ethanol (1 gram). This was stirred until completely dissolved and then hydroxytempo (0.86 gram, 0.005 mol) was added. This was stirred for 5 minutes resulting in an orange colored ink.

A small aliquot 1 mole silver acetate, 4 moles methylamine, 0.5 mole hydroxyltempo, 1 gram ethanol) was then coated onto 3 PET films and each coated film was then tested and heated separately in an oven at room temperature, 50° C., and 130° C. Occasionally, the films were taken out and the weight loss was measured along with the resistivity using a 2 point probe. After a set time at temperature, the room temperature and 50° C. films were heated to 130° C. See Table 4 for results. The underlined times in Table 3 indicated how much time the films were elevated to 130° C. The films were usually taken to a constant weight loss.

TABLE 4

| Time (minutes) | Resistivity (ohms) | | | Time | Weight (grams) | | |
| --- | --- | --- | --- | --- | --- | --- | --- |
| | Room Temperature | 50° C. | 130° C. | | Room Temperature | 50° C. | 130° C. |
| | | | | 0 | 0.115 | 0.109 | 0.063 |
| 5 | liquid | liquid | 20,000,000 | | 0.115 | 0.069 | 0.014 |
| 35 | liquid | 25 | 50 | | Not measured | 0.055 | 0.008 |
| 60 | 10,000 | Not measured | 2 | | 0.072 | Not measured | 0.008 |
| 1 | Not measured | 5 | Not measured | | Not measured | 0.027 | Not measured |
| 30 | Not measured | 0.5 | Not measured | | Not measured | 0.017 | Not measured |
| 60 | 0.5 | 0.3 | 2 | | 0.02 | 0.017 | 0.008 |

Because silver acetate is much less soluble in water, the alcohol enables some solubility of the silver acetate (as it is formed with the amine evaporating) during heating. Note that in the absence of alcohol and quick heating, the silver acetate would precipitate out of solution before reduction by the nitroxide could occur and result in a non-conductive layer.

Images were formed on PET film with the ink of Example 3. The ink of Example 3 was printed at room temperature, 60° C., and 130° C. Solid silver was formed at all three temperatures. The higher the temperature, the faster the conversion of the printed ink into silver.

Thus, silver structures care formed from molecular organic reactive inks, in embodiments, silver precursor inks, with the simple mixing of materials in a short ink formation step and simple heating at different temperatures to afford the silver structures.

Example 4

Prophetic Example 4. To a vial is added silver nitrate (1.69 grams, 0.01 mol) and then butylamine (2.8 grams, 0.04 mol) and stirred until fully dissolved (exothermic reaction which takes about 5 minutes). To this solution is added Irgacure® 250 (4.9 grams). This ink can then be either ink jetted, aerosol jetted, or applied as a gravure or flexographic ink and then exposed to ultra-violet light to give silver metal.

Example 5

Prophetic Example 5. To a vial is added silver nitrate (1.69 grams, 0.01 mol) and then butylamine (2.8 grams, 0.04 mol) and stirred until fully dissolved (exothermic and about 5 minutes). To this can be added NACURE X49-110 (5 grams). This ink can then be either ink jetted, aerosol jetted, or applied as a gravure or flexographic ink and then heated to 100° C. to give silver metal.

Thus, in embodiments, metal structures, in embodiments, silver structures, can be formed from metal precursor inks with the simple mixing of commercially available materials in a short ink formation step and simple exposure to ultra-violet irradiation either at room temperature or elevated temperature, or heating, to afford metal structures.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. An ink composition comprising:
   a metal salt amine complex;
   wherein the metal salt amine complex is formed from a silver salt and an amine;
   a compound selected from the group consisting of a stable free radical, a photoacid generator, and a thermal acid generator; and
   an optional solvent.

2. The ink composition of claim 1, wherein the silver is elemental silver, a silver alloy, or a combination thereof.

3. The ink composition of claim 1, wherein the metal salt amine complex is formed using an amine comprising a member of the group consisting of ammonia, methylamine, ethylamine, propylamine, butylamine, ethylenediamine, and combinations thereof.

4. The ink composition of claim 1, wherein the stable free radical is selected from the group consisting of nitroxides, hydrazyls, trityl radicals, and combinations thereof.

5. The ink composition of claim 1, wherein the stable free radical is a nitroxide selected from the group consisting of hydroxytempo, oxotempo, tempo, and combinations thereof.

6. The ink composition of claim 1, wherein the solvent is selected from the group consisting of water, organic solvents, and combinations thereof.

7. The ink composition of claim 1, wherein the amine of the metal amine complex further functions as the solvent in addition to forming the metal amine complex with the metal salt.

8. The ink composition of claim 1 wherein the metal salt is selected from the group consisting of silver benzoate, silver halide, silver carbonate, silver citrate, silver iodate, silver iodide, silver nitrite, silver nitrate, silver acetate, silver phosphate, silver sulfate, silver sulfide, silver trifluoroacetate, and combinations thereof.

9. The ink composition of claim 1, wherein the silver salt comprises a member selected from the group consisting of silver nitrate, silver acetate, silver fluoride, and combinations thereof.

10. An ink composition comprising:
a silver ammonia complex;
wherein the silver ammonia complex is formed from silver nitrate and ammonia;
a stable free radical; and
an optional solvent.

11. A process comprising:
forming a metal silver salt amine complex, wherein the metal salt amine complex is formed from a silver salt and an amine; and
adding a compound selected from the group consisting of a stable free radical, a photoacid generator, and a thermal acid generator; to the metal salt amine complex to form an ink.

12. The process of claim 11, wherein forming the metal salt amine complex comprises:
combining the silver salt and water; and
adding an amine to form the metal salt amine complex.

13. The process of claim 11, wherein forming the metal salt amine complex comprises:
providing the silver salt;
adding an amine to form the metal salt amine complex;
wherein the amine functions as an ink solvent in addition to forming the metal amine complex with the metal salt.

14. A process comprising:
providing an ink composition comprising a metal salt amine complex, wherein the metal salt amine complex is formed from a silver salt and an amine; a compound selected from the group consisting of a stable free radical, a photoacid generator, and a thermal acid generator; and an optional solvent;
depositing the ink composition onto a substrate to form deposited features; and
treating the deposited features on the substrate to form conductive features on the substrate.

15. The process of claim 14, wherein treating the deposited features comprises evaporating the amine allowing the silver salt of the silver salt amine complex to be reduced on the substrate to form the conductive features.

16. The process of claim 14, wherein treating the deposited features comprises evaporating the amine at room temperature allowing the silver salt of the silver salt amine complex to be reduced on the substrate to form the conductive features; or
wherein treating the deposited features comprises evaporating the amine at an elevated temperature of from about 30 to about 150° C. allowing the silver salt of the silver salt amine complex to be reduced on the substrate to form the conductive features.

17. The process of claim 14 wherein treating the deposited features comprises irradiating the deposited features to generate an acid that reduces the silver salt amine complex to form the conductive features.

* * * * *